United States Patent [19]

Pellegrino et al.

[11] Patent Number: 4,686,014

[45] Date of Patent: Aug. 11, 1987

[54] TURBULENT CELL ELECTROPLATING METHOD AND APPARATUS

[76] Inventors: Peter P. Pellegrino, 216 Edgewood La., Apple Valley, Minn. 55124; Damian Pellegrino, 17029 Harbor Bluff Cir., Huntington Beach, Calif. 92649

[21] Appl. No.: 832,035

[22] Filed: Feb. 21, 1986

Related U.S. Application Data

[62] Division of Ser. No. 674,426, Nov. 23, 1984.

[51] Int. Cl.$^4$ .............................................. C25D 5/02
[52] U.S. Cl. ..................................................... 204/15
[58] Field of Search ........................ 204/15, 24, 26, 27

[56] References Cited

U.S. PATENT DOCUMENTS 4,174,261  11/1979  Pellegrino ........................... 204/275
4,443,304  4/1984   Eidschun ............................. 204/27

*Primary Examiner*—T. M. Tufariello

*Attorney, Agent, or Firm*—Blakely, Sokoloff, Taylor & Zafman

[57] ABSTRACT

Electroplating apparatus and methods for rapid and efficient plating of printed circuit board and the like are disclosed. In accordance with the method, a printed circuit board is disclosed within a tank of electrolyte and caused to oscillate in the plane of the printed circuit board. On each side of the printed circuit board are a plurality of paddle assemblies which are rotated to maintain a high degree of turbulence in the electrolyte adjacent the printed circuit board. Ion replenishment for the electrolyte is provided by baskets filled with pieces of the material to be plated, in the embodiment disclosed the baskets themselves being rotatable and having the paddle assemblies integral therewith. Electrolyte circulation is maintained by pumps with the electrolyte being withdrawn from the tank for filtering and replenishment through manifolds in the walls separating the cells within which the paddle assemblies operate. Various alternate embodiments are described.

7 Claims, 3 Drawing Figures

TURBULENT CELL ELECTROPLATING METHOD AND APPARATUS

This is a divisional of application Ser. No. 674,426 filed Nov. 23, 1984.

BACKGROUND OF THE INVENTION

1. Field of the Invention.

The present invention relates to electroplating apparatus and methods and more particularly, to methods and apparatus for plating of printed circuit boards and the like.

2. Prior Art.

In U.S. Pat. No. 4,174,261, methods and apparatus for providing high and uniform processing rates for electroplating, deplating, etching and the like, substantially independent of the surface geometries of the article subjected to the process are disclosed. In accordance with that process in an electroplating application, the article to be plated is supported on a cathode so that the electrolyte may be forceably sprayed on the article from an array of spray nozzles adjacent the surface thereof. Intermixed with the array of spray nozzles may be a second array of openings providing suction to locally remove most of the sprayed electrolyte after impingement on the workpiece. The net effect is that fresh electrolyte is constantly being sprayed onto the article being plated, including being sprayed into thru-holes of a printed circuit board, with the spent electrolyte being quickly removed from the workpiece before it has an opportunity to shield the surface thereof from the spray of fresh electrolyte. Functionally, the method and apparatus of that patent work very well, resulting in uniform, very high density plating on flat surfaces, and very good distribution along relatively deep thru-holes in printed circuit boards, not generally achievable with other techniques. The process is less than optimum however from a energy and noise standpoint, as a relatively high pumping power is required to give the best results, and the process itself is relatively noisy, particularly with multiple tanks operating in a typical production environment.

BRIEF SUMMARY OF THE INVENTION

Electroplating apparatus and methods for rapid and efficient plating of printed circuit boards and the like are disclosed. In accordance with the method, a printed circuit board is disposed within a tank of electrolyte and caused to oscillate in the plane of the printed circuit board. On each side of the printed circuit board are a plurality of paddle assemblies which are rotated to maintain a high degree of turbulence in the electrolyte adjacent the printed circuit board. Ion replenishment for the electrolyte is provided by baskets filled with pieces of the material to be plated, in the embodiment disclosed the baskets themselves being rotatable and having the paddle assemblies integral therewith. Electrolyte circulation is maintained by pumps, with the electrolyte being withdrawn from the tank for filtering and replenishment through manifolds in the walls separating the cells within which the paddle assemblies operate. Various alternate embodiments are described.

DETAILED DESCRIPTION OF THE INVENTION

Figure 1:
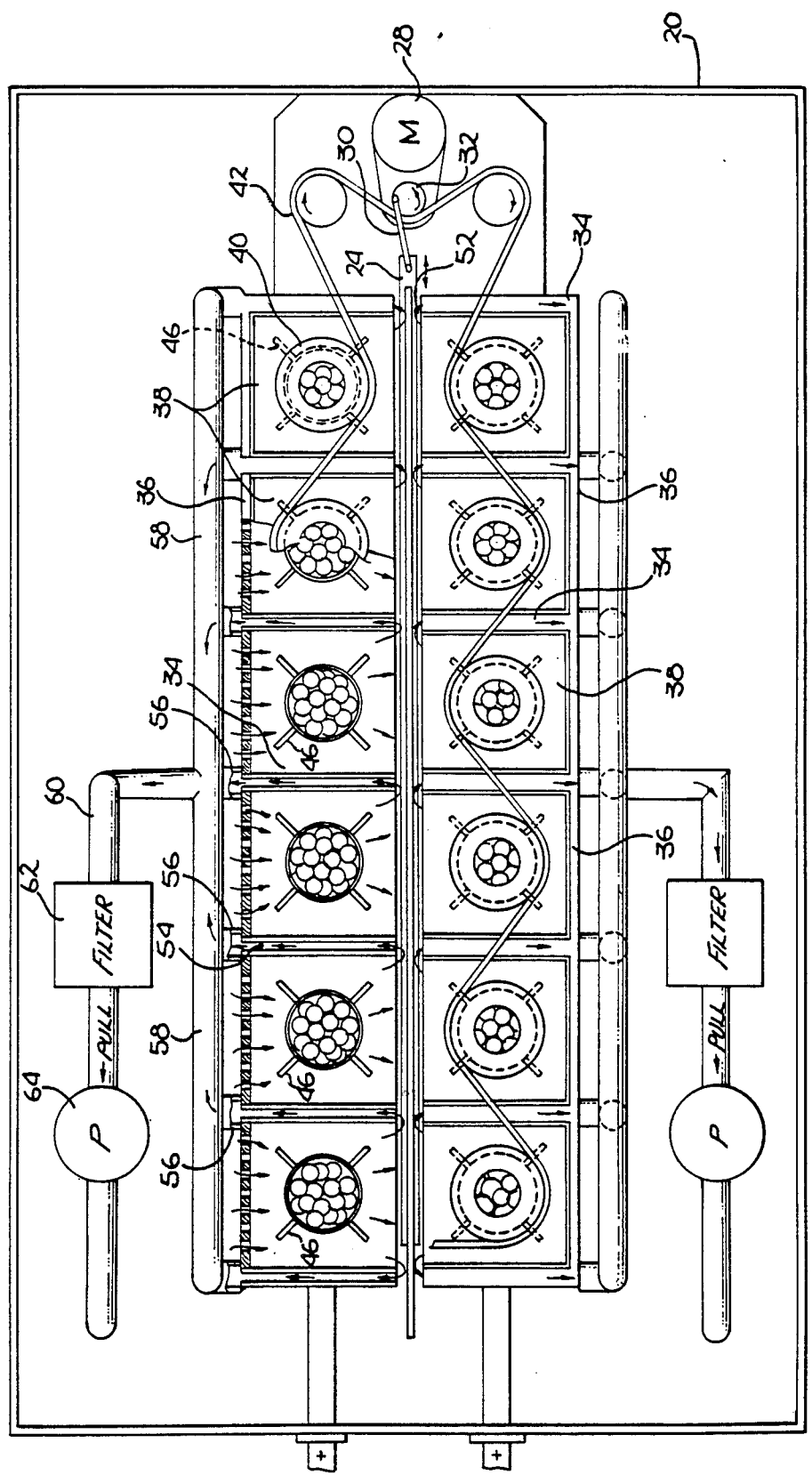
FIG. 1 is a top view of one embodiment of the present invention
Figure 2:
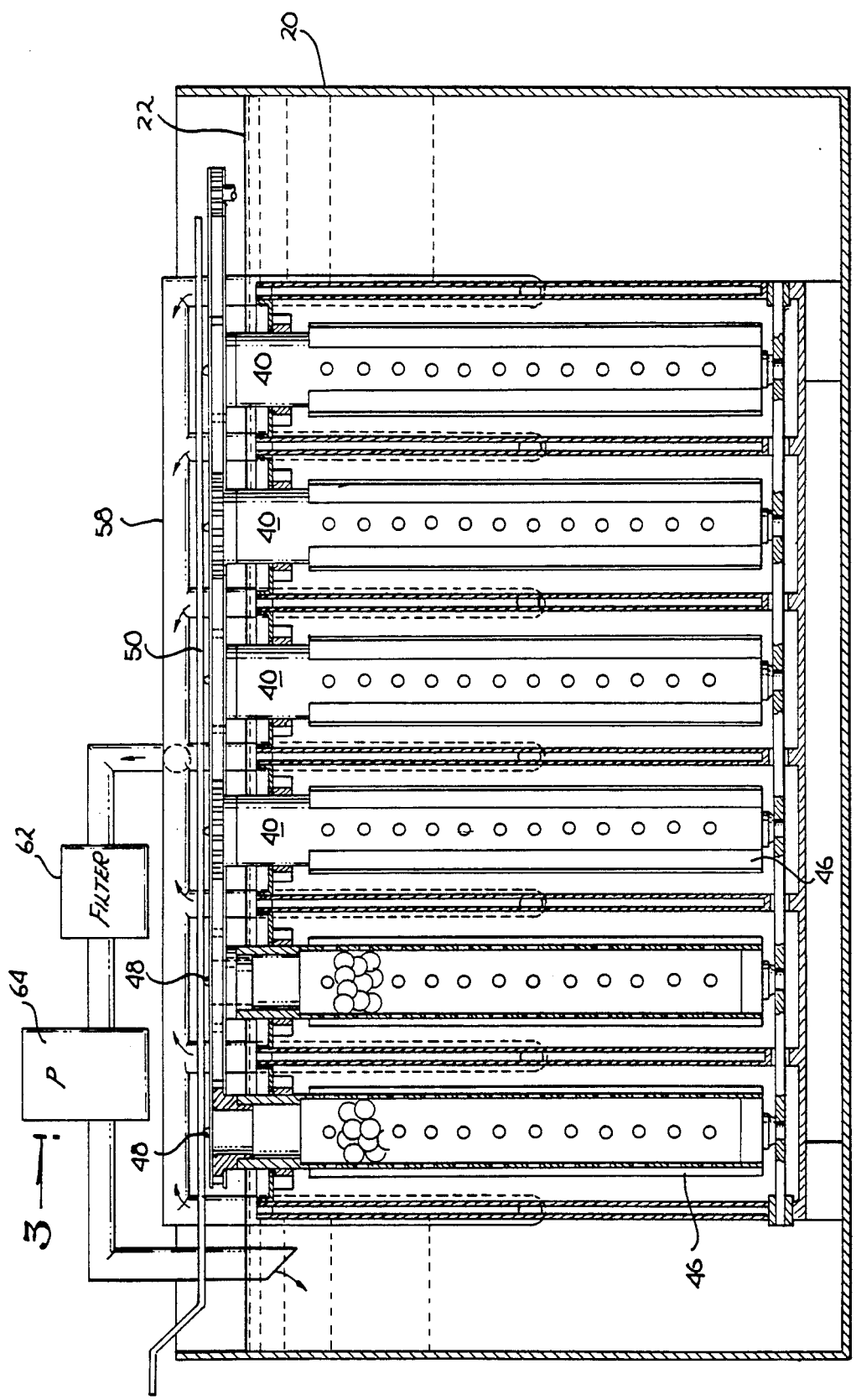
FIG. 2 is a cross section taken along lines 2—2 of FIG. 1
Figure 3:
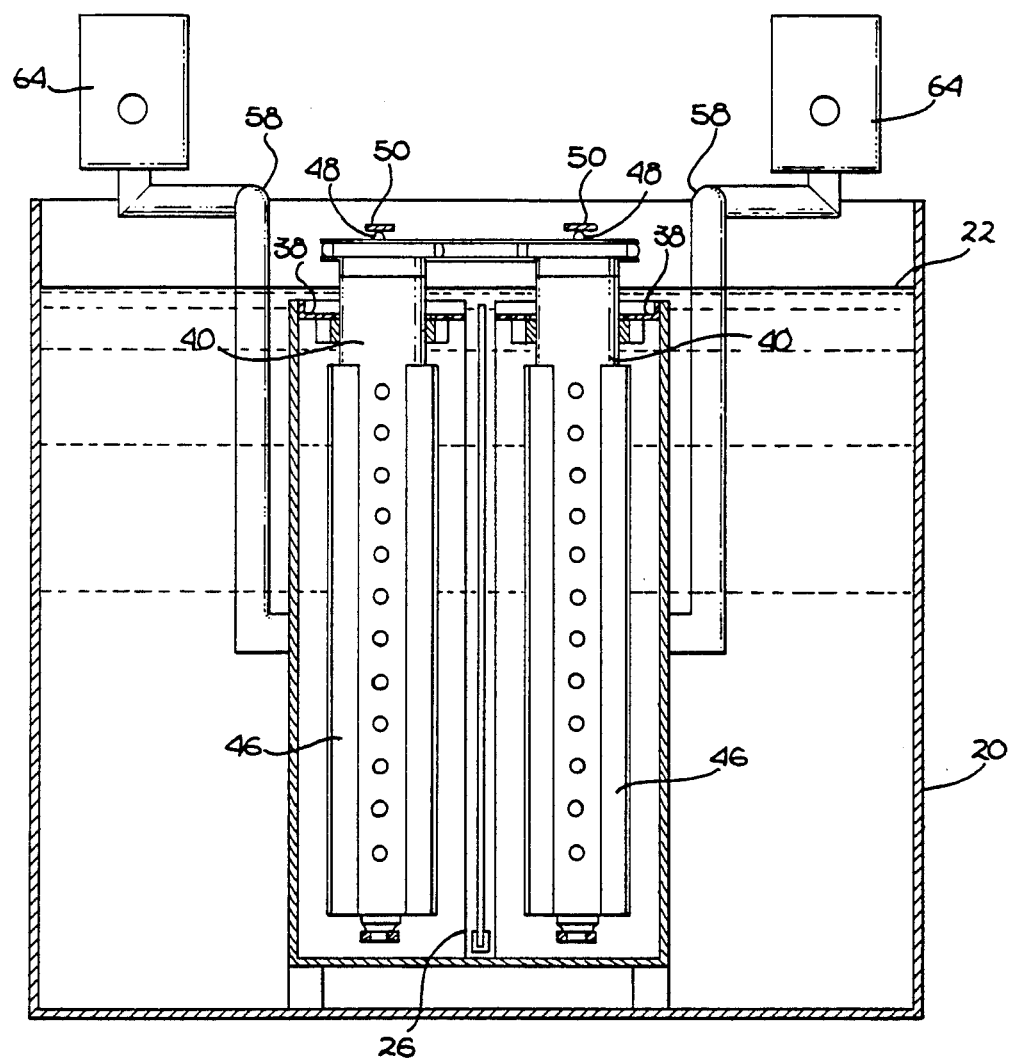
FIG. 3 is a cross section taken along lines 3—3 of FIG. 2.

Referring now to FIGS. 1 through 3, a top view, side view and end view of the apparatus of the present invention may be seen. As may be seen in the figures, the various parts of the invention are mounted within a tank 20, some of the parts being below and some parts being above the preferred electrolyte level 22 visible in FIGS. 2 and 3. Within the tank 20 is a printed circuit board holder 24 mounted within an appropriate slide mechanism 26 (FIG. 3) below the electrolyte level 22 for reciprocating motion along tank 20. For this purpose, a gear motor 28 is provided to drive a connecting rod 30 to couple between the printed circuit board support 24 and sprocket and crank assembly 32.

Also mounted within the tank 20 are structures comprising divider panels 34 and end panels 36, the divider panels and end panels cooperating to define individual cells 38 in side by side relation along both sides of the printed circuit board holder and thus both sides of a printed circuit board held therein, each of the cells 38 having an open face adjacent the printed circuit board. Mounted within each of the cells 38 is a basket-like member 40, rotatable about a vertical axis by way of a chain 42 acting on sprockets 44, the chain being driven in rotation by motor 28 through sprocket member 32. The basket-like members 40 are generally porous members, preferably fabricated either of some form of heavy screening or as particularly illustrated in FIGS. 2 and 3, a perforated tubular member, sufficiently perforated so as to allow the relatively free flow of electrolyte therethrough while still retaining pieces of the metal to be plated therein.

Fastened to the outer diameter of the basket-like members 40 are paddle wheel-like protrusions 46 which, upon rotation of the basket-like members, encourage substantial turbulence and constant mixing of the electrolyte within the cell, and more importantly, a constant mixing of the bulk electrolyte within the cell with the electrolyte immediately adjacent the printed circuit board, thereby replenishing any depleted electrolyte adjacent the printed circuit board with enriched electrolyte from the enriched bulk electrolyte in the cell. The constant mixing and turbulence caused by the rotation of the paddle wheel-like baskets also causes substantial exchange between the electrolyte within the basket and that surrounding the basket, causing constant and rather thorough electrolyte enrichment in each of the cells. In that regard, the baskets themselves are preferable either fabricated from a metal which is substantially resistant to deplating or alternatively, a suitable plastic within which an appropriate electrode is placed to make contact with the pieces of metal to be plated contained therein. In general, whether the baskets are electrically conductive or if special electrodes are placed therein, electrical contact with the baskets or electrodes is provided through center axis contacts 48 (see FIGS. 2 and 3) making contact with bus bars 50 thereabove coupled to one electrode of a suitable DC power supply, the other electrode of the power supply being coupled through line 52 to the printed circuit board itself.

In electroplating tanks in general, it is desirable to provide some circulation of the plating solution for various reasons, including the ability to provide filtering to keep the solution as clean as possible. In the present invention, the circulation of the plating solution cooperates with the stirring or turbulent mixing which occurs within the cell 38 to further assure that the printed circuit board is always exposed to fresh electrolyte. In particular, in the present invention, the divider panels 34 are ported (some of the divider panels being shown in cross section in FIG. 1 to illustrate this porting) so as to have electrolyte conduits 54 through the divider panels 34 to a position immediately adjacent a printed circuit board in the printed circuit board holder. The porting 54 is generally manifolded in region 56, with the various manifolds coupled together through line 58 for discharge through line 60 and filter 62 by discharge pump 64. Porting 54 may comprise a series of holes through the divider panels, a single hole therethrough terminating in a vertical channel adjacent the end of the divider panels facing the printed circuit board or even spaced apart wall sections to allow the flow of electrolyte therebetween. In any event, the function of this manifolding is to remove by suction the layer of electrolyte immediately adjacent the adjacent surface of the printed circuit board, that electrolyte being the most susceptible to depletion because of the plating of the ions therefrom onto the surface of the printed circuit board, and of course being the most susceptible to relative stagnation because of the adjacent printed circuit board. Because of the reciprocal motion of the printed circuit board induced by gear motor 28, each area of the printed circuit board repetitively sweeps across at least one of the manifold members or divider panels 34, which assures that the electrolyte is periodically withdrawn from adjacent all areas of the printed circuit board, and further assures that no area of the printed circuit board remains adjacent one of the divider panels for any prolonged period of time.

In operation, pumps 64 remove electrolyte from adjacent printed circuit board, effectively along spaced apart vertical lines on both sides of the printed circuit board, the region of evacuation of the electrolyte effectively sweeping across the entire printed circuit board as a result of the oscillation of the board within the tank. In so doing, the electrolyte flows through filter 62 which removes particulate matter from the electrolyte to assure that the electrolyte remains clean, the cleaned electrolyte being delivered to the tank 20 through line 66 (see FIG. 2). The electrolyte withdrawn from adjacent the surface of the printed circuit board is of course made up by the replenished electrolyte in each of the cells 38, with the electrolyte withdrawn being made up by flow through the porous or perforated end panels 36. This electrolyte, comprising bulk electrolyte from tank 20, may be relatively depleted, though is quickly mixed and replenished in each of the cells by the action of the paddle wheel-like member and the plating material baskets therein. Also, the constant agitation of the electrolyte in each cell causes much mixing of the somewhat depleted electrolyte adjacent the printed circuit board with the bulk enriched electrolyte in each cell as practical. Finally, the removal of the layer of electrolyte immediately adjacent the printed circuit board by the effective sweeping of the printed circuit board by the manifold members or divider panels 34 provides not only a means for circulating and filtering the electrolyte, but for also removing the electrolyte adjacent the printed circuit board less prone to constant mixing with the bulk electrolyte in each cell.

The net result of the present invention is that the printed circuit board is always surrounded by a relatively fresh electrolyte and as such, relatively high plating rates may be used to obtain a high quality, high density plate relatively insusceptible to burning and other undesired effects. The mechanical agitation rather than the hydrodynamic agitation of U.S. Pat. No. 4,174,261 has the advantage of requiring much less power and of being relatively quiet while still adequately eliminating the conventional tendency of the article to be plated to be surrounded by relatively depleted electrolyte. The withdrawing of the electrolyte through manifold members adjacent the printed circuit board of course withdraws any depleted electrolyte not reasonably susceptible to intermixing with the bulk electrolyte in the cells. In that regard, obviously the replenishing of the electrolyte may be carried out in some other fashion such as, by way of example, some form of basket or container through which the recirculated electrolyte flows so that all electrolyte in tank 20 is effectively replenished, or alternatively, by means of stationary electrode baskets in additional cells adjacent end panels 16 so that the electrolyte is replenished prior to flowing through the end panels 36 into cells 38. The use of the combined electrode baskets and paddle wheel members is preferred however, as the same turbulence which assures good plating also assures good replenishment of the plating solution. Obviously, of course, the same apparatus will also provide the desired result for electroless plating, though solution replenishment in general will be carried out differently. Thus, while the preferred embodiment of the present invention has been disclosed and described herein, it will be understood by those skilled in the art that various changes may be made in form and detail without parting from the spirit and scope thereof.

We claim:

1. A method of plating the surface of a printed circuit board comprising the steps of
    (a) emersing the printed circuit board in a plating solution in a tank;
    (b) mechanically agitating the plating solution to provide substantial agitation to the plating solution adjacent the printed circuit board; and
    (c) withdrawing plating solution from predetermined position adjacent the surface of the printed circuit board for return to the tank.

2. The method of claim 1 further comprised of the step of replenishing the plating solution.

3. The method of claim 1 further comprised of providing relative motion between the printed circuit board and the predetermined positions of plating solution withdrawal whereby no area of the printed circuit board is continuously adjacent any of the predetermined positions.

4. A method of plating the surface of an article comprising the steps of
    (a) emersing the article in a plating solution in a tank;
    (b) mechanically agitating the plating solution to provide substantial agitation to the plating solution adjacent the article; and
    (c) withdrawing plating solution from predetermined positions adjacent the surface of the article for return to the tank.

5. The method of claim 4 further comprised of the step of replenishing the plating solution.

6. The method of claim 4 further comprised of providing relative motion between the article and the predetermined position of plating solution withdrawal whereby no area of the printed circuit board is continuously adjacent any of the predetermined positions.

7. The method of claim 6 wherein the relative motion is caused by causing cyclical movement of the article to be plated.

* * * * *